(12) United States Patent
Ol et al.

(10) Patent No.: US 8,271,124 B2
(45) Date of Patent: Sep. 18, 2012

(54) DECOMPRESSING TYPE HEATER, ITS HEATING METHOD, AND ELECTRONIC PRODUCT MANUFACTURING METHOD

(75) Inventors: Sotaro Ol, Saitama (JP); Masanari Matsuura, Chiryu (JP); Tomoyuki Kubota, Yatsushiro (JP); Masaya Tsuruta, Kumamoto (JP)

(73) Assignees: Toyota Jidosha Kabushiki Kaisha, Toyota (JP); Hirata Corporation, Tokyo (JP)

( * ) Notice: Subject to any disclaimer, the term of this patent is extended or adjusted under 35 U.S.C. 154(b) by 376 days.

(21) Appl. No.: 12/451,070

(22) PCT Filed: Dec. 8, 2008

(86) PCT No.: PCT/JP2008/072230
§ 371 (c)(1),
(2), (4) Date: Oct. 23, 2009

(87) PCT Pub. No.: WO2009/090808
PCT Pub. Date: Jul. 23, 2009

(65) Prior Publication Data
US 2010/0121479 A1 May 13, 2010

(30) Foreign Application Priority Data
Jan. 17, 2008 (JP) ................................ 2008-007953

(51) Int. Cl.
*G06F 19/00* (2006.01)
(52) U.S. Cl. ............................ 700/212; 702/134; 438/14
(58) Field of Classification Search .................. 700/212; 118/715, 724, 725; 438/14; 427/8; 374/126, 374/129, 130; 156/345.27
See application file for complete search history.

(56) References Cited

U.S. PATENT DOCUMENTS

| | | | | |
|---|---|---|---|---|
| 5,707,500 A | * | 1/1998 | Shimamura et al. | 204/298.03 |
| 5,810,934 A | * | 9/1998 | Lord et al. | 118/725 |
| 5,815,396 A | * | 9/1998 | Shimamura et al. | 700/123 |
| 5,816,311 A | * | 10/1998 | Osada et al. | 164/415 |
| 6,087,261 A | * | 7/2000 | Nishikawa et al. | 438/685 |
| 6,183,127 B1 | * | 2/2001 | Hebb et al. | 374/9 |
| 6,204,484 B1 | * | 3/2001 | Tay et al. | 219/411 |
| 6,579,731 B2 | * | 6/2003 | Yun | 438/14 |
| 6,753,272 B1 | * | 6/2004 | Lee et al. | 438/795 |

(Continued)

FOREIGN PATENT DOCUMENTS

JP A-09-311081 12/1997
(Continued)

*Primary Examiner* — Dave Robertson
(74) *Attorney, Agent, or Firm* — Oliff & Berridge, PLC

(57) ABSTRACT

An object is heated to a preheating temperature in an atmosphere of a reducing gas under the atmospheric pressure while adjusting the setting of the emissivity of a non-contact temperature measuring part and regulating the temperature of the object according to the measured value measured by a contact temperature measuring part. The pressure of the atmosphere is reduced. The object is further heated to a heating temperature under a lowered pressure while regulating the temperature of the object according to the measured value measured by the non-contact temperature measuring part whose setting of the emissivity is adjusted during the heating process to the preheating temperature. The pressure of the atmosphere is increased back to the atmospheric pressure while maintaining the heating temperature of the object. The temperature of the object is decreased under the atmospheric pressure. With this, in the process of heating an object under a lowered pressure, the actual temperature of the object is managed over the whole steps, and the object can be most suitably heated according to the actual temperature.

20 Claims, 9 Drawing Sheets

U.S. PATENT DOCUMENTS

| | | | |
|---|---|---|---|
| 6,780,657 B2 * | 8/2004 | Ino et al. | 438/14 |
| 7,921,803 B2 * | 4/2011 | Yudovsky et al. | 118/712 |
| 7,957,926 B2 * | 6/2011 | Timans | 702/99 |
| 7,974,524 B2 * | 7/2011 | Yamazaki et al. | 392/407 |
| 8,021,898 B2 * | 9/2011 | Ahmad et al. | 438/14 |
| 2005/0156324 A1 | 7/2005 | Nakase et al. | |
| 2007/0235134 A1 * | 10/2007 | Iimuro | 156/345.27 |

FOREIGN PATENT DOCUMENTS

| | | |
|---|---|---|
| JP | A-2000-218151 | 8/2000 |
| JP | A-2005-024436 | 1/2005 |
| JP | A-2005-205418 | 8/2005 |
| JP | A-2007-246938 | 9/2007 |

* cited by examiner

DECOMPRESSING TYPE HEATER, ITS HEATING METHOD, AND ELECTRONIC PRODUCT MANUFACTURING METHOD

TECHNICAL FIELD

The present invention relates to a heating technique for heating an object under lowered pressure. For example, the present invention relates to a heater for solder joining a board and an electronic product under lowered pressure and a heating method thereof. Furthermore, the present invention relates to a method of manufacturing an electronic product by the heater.

BACKGROUND ART

As a method of manufacturing an electronic product to be manufactured by solder joining a first joining member (e.g. a substrate) and a second joining member (e.g. an electronic component), there is a method achieved by supplying solder to the first joining member, placing the second joining member thereon, and heating them to be soldered to each other in a heater. In this solder joining using such heating method, however, holes (hereinafter, referred to as voids) may be generated in a solder joint portion. The presence of the voids may cause peeling of the joint portion or a decrease in heat conduction efficiency from the second joining member (the electronic component) to the first joining member (the substrate).

To avoid a deterioration in product quantity resulting from the voids, therefore, a decompressing type heater for solder joining under lowered pressure is sometimes used. Even if gas is taken in the solder and voids are generated under lowered pressure, the voids are contracted when the atmosphere is returned to atmospheric pressure by supply of inert gas or the like. A method of manufacturing an electronic product by solder joining under lowered pressure is disclosed in Patent Literature 1.

CITATION LIST

Patent Literature
Patent Literature 1: JP2005-205418A

SUMMARY OF INVENTION

Technical Problem

Meanwhile, in the manufacturing of an electronic product by the decompressing type heater, a heater temperature and others in a furnace are controlled to ensure the quality of the electronic product to be manufactured. This is because the characteristics of the electronic product tend to change if the temperature of the electronic product becomes too high and, on the other hand, appropriate solder joining could not be performed if the temperature of solder is insufficient. To ensure the characteristics of the electronic product and the solder joining, it is therefore preferable to ascertain the actual temperature of an object rather than the atmospheric temperature.

However, in the method of manufacturing the electronic product by the decompressing type heater, it is hard to accurately measure the temperature of the object because the pressure in the heater changes. This is because, in the case of measuring the temperature of the object by use of a contact thermometer as shown in FIG. 1, a gap exists between the object and the contact thermometer as shown in FIG. 2 (an enlarged view of a region II in FIG. 1).

This causes the following problem under lowered pressure. As atmospheric gas in the gap is reduced in pressure, the thermal conductivity of the gap decreases and changes. Accordingly, a difference (deviation) is caused between the actual temperature of the object and the temperature measured by the contact thermometer. By this change in thermal conductivity, the temperature measured by the contact thermometer is lower than the actual temperature of the object. Thus, when a heating condition of the object is controlled based on a measured value of the contact thermometer, the temperature of the object would increase more than a target value.

On the other hand, even by the use of a radiation thermometer, it is difficult to accurately measure the temperature of the object by the radiation thermometer alone. Because the object is heated to a temperature (a pre-heating target temperature) lower than the solidus of solder under atmospheric pressure and then the temperature is kept for a while for pre-heating, and the surface of the object is deoxidized and cleaned by the pre-heating in a reducing gas. Accordingly, the surface condition of the object is changed. If the emissivity of the radiation thermometer is set in correspondence with the object before cleaning, the measured temperature diverges from the actual temperature of the object as the surface condition of the object changes. That is, when the pressure and the surface condition of the object change, the temperature of the object could not be measured accurately even if the contact thermometer or the radiation thermometer is used singularly.

The present invention has been made to solve the above problems of the prior arts and has a purpose to provide a decompressing type heater and a heating method thereof capable of controlling an actual temperature of an object in all the steps of heating the object under lowered pressure to heat the object appropriately based on the actual temperature, and a method of manufacturing an electronic product by solder joining using the heater and the heating method.

Solution to Problem

A decompressing type heater of the present invention made to achieve the above purpose is decompressing type heater having a heat treatment chamber formed with an outlet port, the heater being configured to pre-heat an object placed in the heat treatment chamber to a pre-heating temperature under atmospheric pressure and heat the object to a higher temperature than the pre-heating temperature under lowered pressure, the heater comprising: a heater for heating the object in the heat treatment chamber; a contact temperature measuring part for measuring the temperature of the object in contact relation therewith in the heat treatment chamber; a non-contact temperature measuring part for measuring the temperature of the object in non-contact relation therewith in the heat treatment chamber; and a controlling part for controlling the heater and adjusting the non-contact temperature measuring part, the controlling part being adapted to adjust the non-contact temperature measuring part to eliminate a difference of a measured value of the non-contact temperature measuring part with respect to a measured value of the contact temperature measuring part during pre-heating under atmospheric pressure, and to control the heater based on the measured value of the adjusted non-contact temperature measuring part during heat treatment under lowered pressure. The above decompressing type heater can accurately measure the temperature of the object to be heated under lowered pressure as well as under atmospheric pressure, and performs heat treatment of the object under accurate temperature control based on the actual temperature of the object.

In the aforementioned decompressing type heater, preferably, the non-contact temperature measuring part is a radiation thermometer for detecting infrared rays emitted from the object to be heated, and the controlling part adjusts setting of emissivity in the radiation thermometer during the pre-heating under atmospheric pressure. This can accurately measure the temperature of the object even under lowered pressure.

In the aforementioned decompressing type heater, preferably, the non-contact temperature measuring part is a radiation thermometer for detecting infrared rays emitted from the object to be heated, and the controlling part adjusts a correction coefficient of an output value of the radiation thermometer during the pre-heating under atmospheric pressure. This can accurately measure the actual temperature of the object as above.

In the aforementioned decompressing type heater, preferably, the heat treatment chamber is formed with a gas inlet port, and the pre-heating under atmospheric pressure is performed while a reducing atmospheric gas is supplied into the heat treatment chamber. Accordingly, the deoxidizing reaction occurs in the surface of the object, thereby cleaning the surface.

In the aforementioned decompressing type heater, preferably, the heater includes a gas supplying unit for supplying atmospheric gas into the heat treatment chamber through the gas inlet port. Thus, a reducing atmospheric gas can be fed into the heat treatment chamber.

The aforementioned decompressing type heater, preferably, further includes an exhausting unit connected to the outlet port to discharge gas from the heat treatment chamber to lower internal pressure. This makes it possible to lower the pressure in the heat treatment chamber.

Furthermore, a heating method of the present invention is a method of heating an object under temperature control using a contact temperature measuring part and a non-contact temperature measuring part, the method comprising: heating the object to a pre-heating temperature lower than a heat treatment temperature in an atmosphere of deoxidizing gas under atmospheric pressure while adjusting setting of emissivity in the non-contact temperature measuring part based on a measured value of the contact temperature measuring part and controlling the temperature of the object, and further heating the object to the heat treatment temperature under lowered pressure while controlling the temperature of the object based on a measured value of the non-contact temperature measuring part having the setting of emissivity adjusted in the process of heating to the pre-heating temperature. This method can heat the object while strictly controlling the temperature thereof without being affected by changes in atmospheric pressure and cleaning of the object.

Moreover, a method of manufacturing an electronic product of the present invention is A method of manufacturing an electronic product by heating an object including a plurality of members to be joined under lowered pressure to solder join them, the method comprising: heating the object to a pre-heating temperature at which solder does not melt in an atmosphere of deoxidizing gas under atmospheric pressure while adjusting setting of emissivity in the non-contact temperature measuring part based on a measured value of the contact temperature measuring part and controlling the temperature of the object; lowering pressure; further heating the object to the heat treatment temperature under lowered pressure while controlling the temperature of the object based on a measured value of the non-contact temperature measuring part having the setting of emissivity adjusted in the process of heating to the pre-heating temperature; returning the pressure of the atmosphere to the atmospheric pressure while maintaining the heat treatment temperature of the object; and solidifying the solder under the atmospheric pressure to solder join the object. This manufacturing method of an electronic product can solder join the object while strictly controlling the temperature of the object to be solder joined. Furthermore, this is unlikely to generate voids in the solder. It is further possible to prevent changes in the characteristics of the electronic product.

Advantageous Effects of Invention

According to the present invention, there are provided a decompressing type heater and a heating method thereof capable of controlling an actual temperature of an object in all the steps of heating the object under lowered pressure to heat the object appropriately based on the actual temperature, and a method of manufacturing an electronic product by solder joining using the heater and the heating method.

REFERENCE SIGNS LIST

Figure 1:
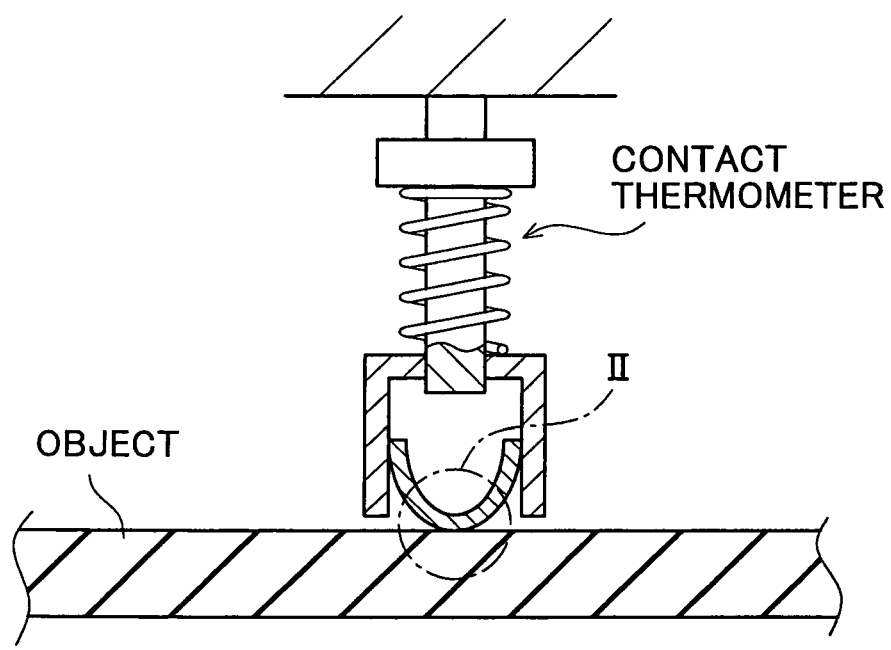
FIG. 1 is a view (Part 1) to explain a contact temperature measuring part during measurement.

10 Substrate
20 Electronic component
30 Solder
100 Decompressing type heater
110 Contact temperature measuring part
112 Temperature indicator
120 Radiation thermometer
121 Radiation thermometer controller
130 Heater
140 Inlet port
150 Outlet port
170 Heater controller
180 Control part
190 Chamber
200 Temperature controlling system
340 Gas supply unit
350 Exhaust unit

DESCRIPTION OF EMBODIMENTS

A detailed description of a preferred embodiment of the present invention will now be given referring to the accompanying drawings. This embodiment embodies the present invention about a decompressing type heater, a heating method thereof, and a method of manufacturing an electronic product by using them.

Figure 3:
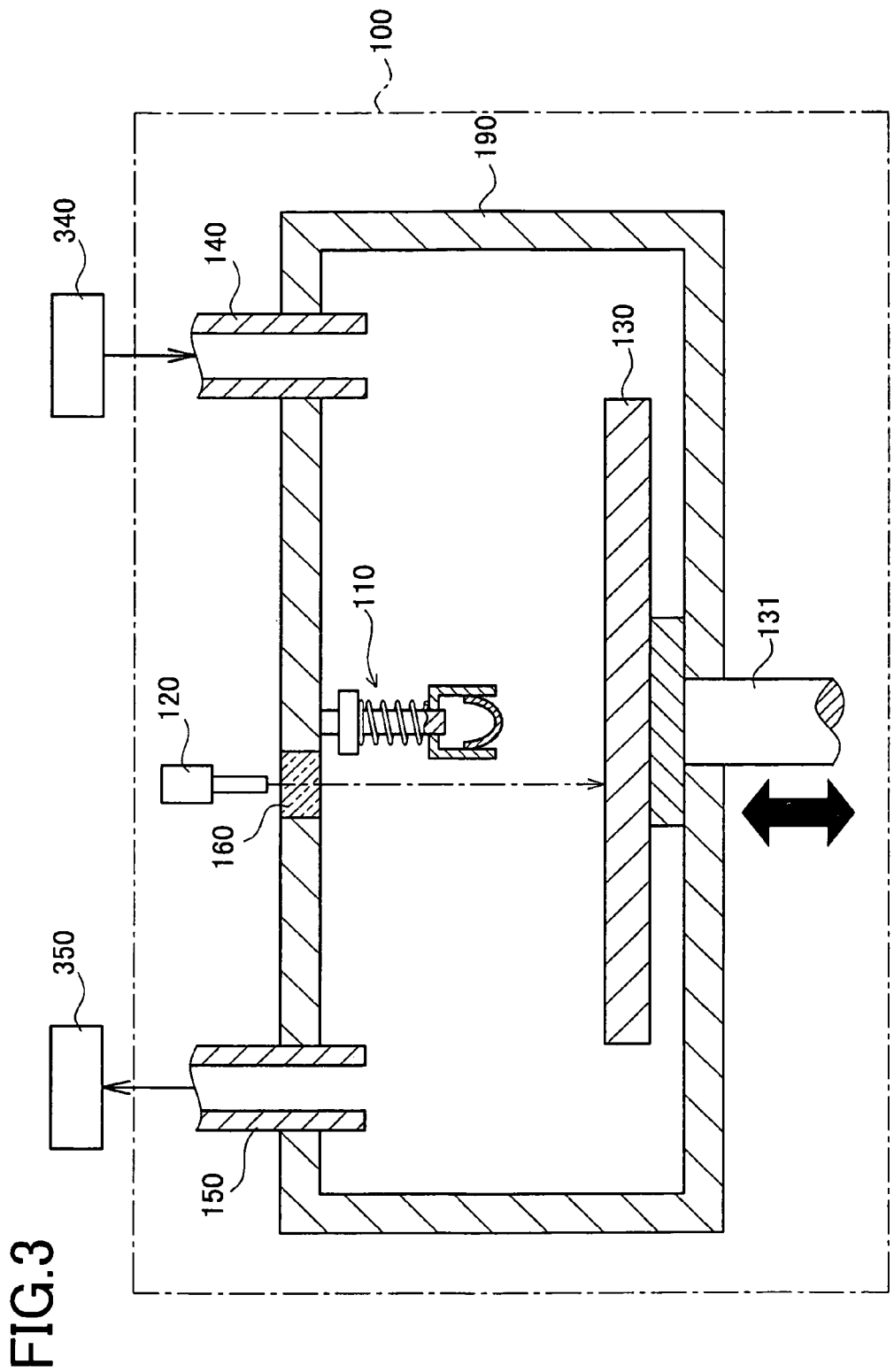
FIG. 3 is a view to explain a configuration of a decompressing type heater according to the present invention.

The decompressing type heater is first explained below. As shown in FIG. 3, a decompressing type heater 100 includes an inlet port 140, an outlet port 150, a contact temperature measuring part 110, a radiation thermometer 120, a heater 130, a cylinder 131, a quartz window 160, and a chamber 190.

The decompressing type heater 100 is arranged to perform heat treatment of an object to be heated in the chamber 190. The chamber 190 is a heat treatment chamber which is airtightly closed during heat treatment and the internal atmosphere is replaced through the outlet port 150 and the inlet port 140 for atmosphere replacement. Furthermore, the chamber 190 is configured to be controllable of the internal pressure thereof. Specifically, the pressure in the chamber 190 is lowered by discharging gas through the outlet port 150 and returned to atmospheric pressure by taking in gas through the inlet port 140. In use, the outlet port 150 is connected to an exhaust unit 350 such as a vacuum pump and the inlet port 140 is connected to a gas supply unit 340 for supplying reducing gas, inert gas, or the like.

Figure 4:
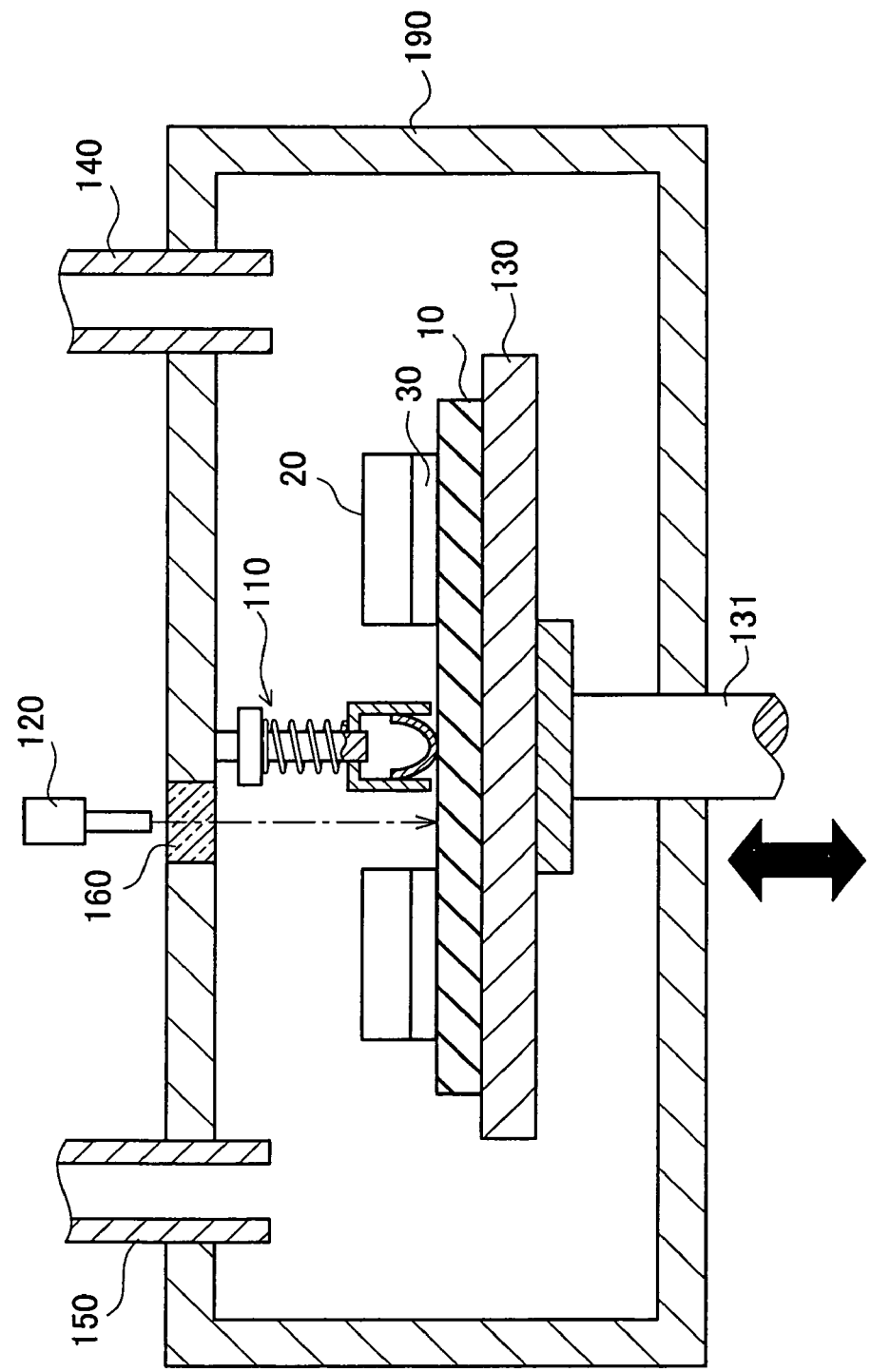
FIG. 4 is a view to explain the decompressing type heater during heating according to the present invention.

An example of using the decompressing type heater 100 for solder joining is explained referring to FIG. 4. The heater 100 is configured as above to heat a substrate 10, an electronic component 20, and solder 30 placed therein under lowered pressure, thereby melting the solder 30 and joining the substrate 10 and the electronic component 20.

Figure 2:
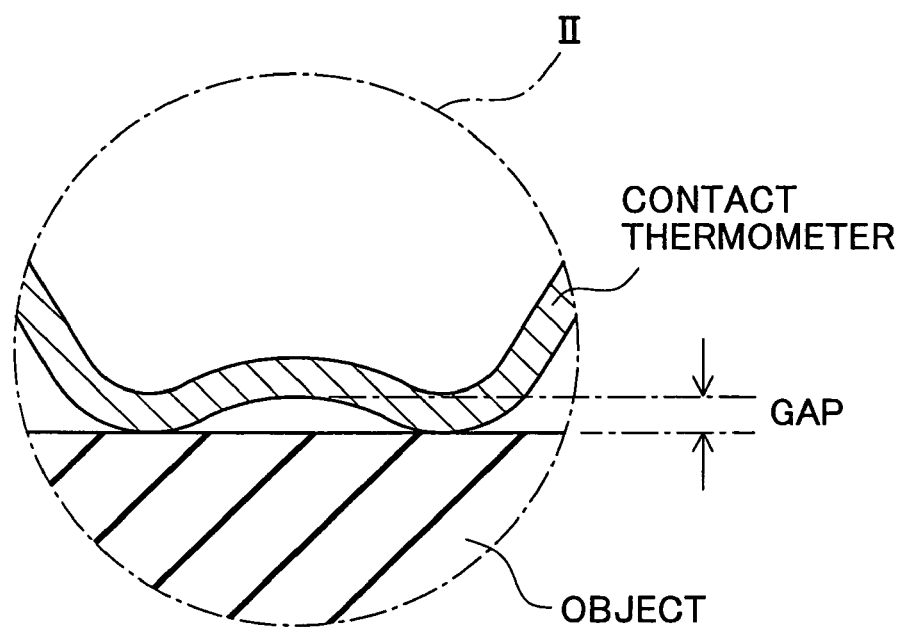
FIG. 2 is a view (Part 2) to explain the contact temperature measuring part during measurement.

The heater 130 serves to heat the substrate 10 in contact relation therewith. The cylinder 131 is a lifting mechanism for moving the heater 130 up and down. The lifting mechanism may be not only the cylinder but also any mechanism capable of moving up and down a table-like member to be lifted. The lifting mechanism may be connected to the contact temperature measuring part 110 instead of the heater 130. The contact temperature measuring part 110 is placed in contact with a portion of the substrate 10 to measure a temperature of the contact portion. At a leading end of the contact temperature measuring part 110, there is a gap from the object as shown in FIG. 2. The radiation thermometer 120 is a non-contact temperature measuring part using infrared rays to measure the surface temperature of the substrate 10 in non-contact relation therewith. The quartz window 160 is a window provided to allow the radiation thermometer 120 to detect the infrared rays emitted from the substrate 10. Herein, the non-contact temperature measuring part is not limited to the type using infrared rays and may be any non-contact temperature sensor if only a temperature error occurs between an actual temperature and a measured temperature as the surface condition of the substrate 10 changes before and after pre-heating mentioned later.

Figure 5:
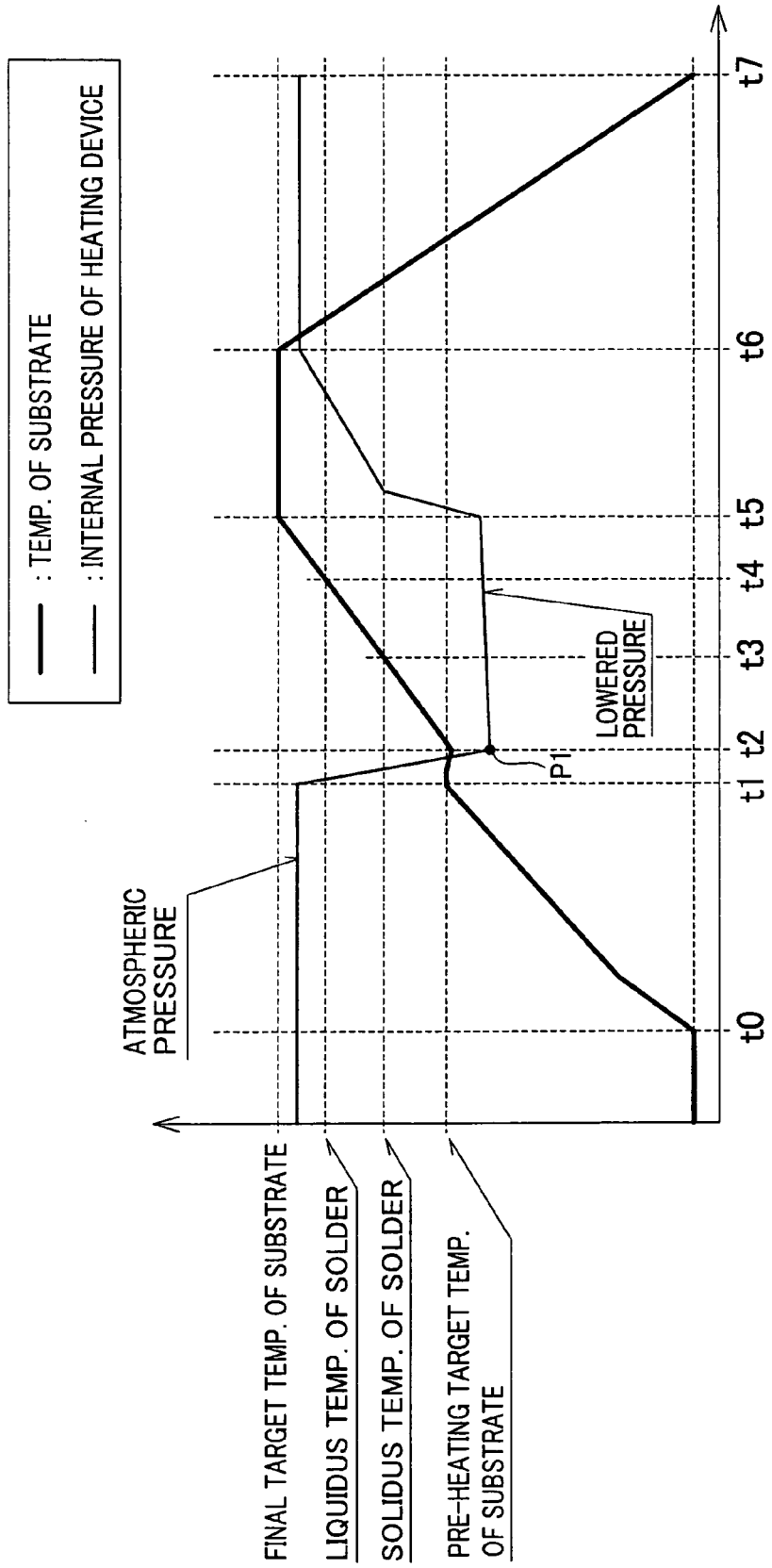
FIG. 5 is a graph to explain a method of manufacturing an electronic product by use of the decompressing type heater according to the present invention.

The method of manufacturing the electronic product by use of the decompressing type heater 100 is explained below referring to FIGS. 4 and 5. The electronic product manufacturing method in this embodiment includes two-stage heating. In a first heating step (a pre-heating step), the substrate 10 is heated under atmospheric pressure to a pre-heating target temperature in a mixed gas atmosphere of inert gas and reducing gas. During this pre-heating, the surface of wiring on the substrate 10 is deoxidized and hence wettability to the solder 30 is increased. Thus, appropriate solder joining can be achieved. Then, the pressure is decreased to a pressure P1 (e.g. 10 kPa or lower) while the pre-heating target temperature is maintained.

A second heating step is performed under lowered pressure, because solder joining under lowered pressure prevents the generation of voids. Even if voids appear under lowered pressure, the voids should contract when the internal pressure of the decompressing type heater 100 is returned to atmospheric pressure. After this heating, the internal pressure of the heater 100 is returned to atmospheric pressure and then the temperature is decreased to solidify the solder 30.

Herein, the pre-heating target temperature of the substrate 10 is a target temperature in the first heating step to pre-heat the substrate 10 and thus is set lower than a solidus temperature of the solder 30 in order to prevent the solder 30 from starting to melt. A final target temperature of the substrate 10 is set higher than a liquidus temperature of the solder 30 in order to sufficiently melt the solder 30 to spread in a wet state. However, it must not exceed an upper temperature limit of the electronic component 20. The solidus temperature of the solder 30 used herein is about 235° C. and the liquidus temperature of the solder 30 is about 240° C.

An object, i.e., the substrate 10 on which the solder 30 and the electronic component 20 are placed, is first put in the decompressing type heater 100. The object is set on the heater 130. After that, a mixture of inert gas such as nitrogen and reducing gas such as hydrogen is supplied into the heater 100. The internal pressure of the heater 100 after atmosphere replacement is almost equal to atmospheric pressure.

The heater 130 is then moved up by the cylinder 131. When the substrate 10 comes into contact with the contact temperature measuring part 110, the upward movement of the heater 130 is stopped.

(Time t0)

Then, the first heating step is performed. The time at which the heater 130 starts to heat the substrate 10 is referred to as t0.

(Time t0 to t1)

After time t0, the substrate 10 is heated by the heater 130 under atmospheric pressure. The solder 30 and the electronic component 20 are heated through the substrate 10. Since the atmosphere has been replaced with the reducing gas, the heating during this period causes a deoxidization reaction at the oxidized surfaces of the substrate 10, solder 30, and electronic component 20. By this cleaning, the surface wettability of the substrate 10 with respect to the solder 30 is enhanced.

(Time t1)

The time at which the substrate 10 reaches the pre-heating target temperature is referred to as t1. At that time, the solder 30 does not reach the solidus temperature and does not melt yet. Furthermore, it is an advanced state of the cleaning of the substrate 10, solder 30, and electronic component 20.

(Time t1 to Time t2)

After time t1, the gas is discharged from the heater 100 through the outlet port 150. Accordingly, the internal pressure of the heater 100 decreases. The temperature of the substrate 10 remains almost equal to the temperature of the substrate 10 at time t1.

(Time t2)

At the time when the internal pressure of the heater 100 has decreased, the gas discharging through the outlet port 150 is stopped. This time is referred to as t2.

(Time t2 to Time t5)

After time t2, the second heating step is started. This heating is conducted while the internal pressure of the heater 100 is maintained in a lowered state.

(Time t3)

The time at which the temperature of the substrate 10 reaches the solidus temperature of the solder 30 is referred to as t3. At this time, the solder 30 and the electronic component 20 should have reached the temperature almost equal to the substrate 10. Thus, the solder 30 starts to melt.

(Time t4)

The time at which the temperature of the substrate 10 reaches the liquidus temperature of the solder 30 is referred to as t4. At this time, the solder 30 and the electronic component 20 should have reached the temperature almost equal to the substrate 10. Thus, almost the entire solder 30 is in a molten state.

(Time t5)

The time at which the substrate 10 reaches the final target temperature is referred to as t5. At time t5, the heating by the heater 130 is stopped. At this time, the solder 30 has completely melted and spread in a wet state. In this state, even if voids have appeared in the solder 30, the internal pressure of the voids is almost equal to the internal pressure of the heater 100.

(Time t5 to Time t6)

After time t5, inert gas or a mixture of inert gas and reducing gas is supplied little by little into the heater 100 through the inlet port 140 while the temperature of the substrate 10 is maintained constant. Accordingly, the internal pressure of the furnace gradually increases. At this time, the solder 30 remains melted. Even if voids have appeared in the solder 30, the voids will contract as the internal pressure of the heater 100 increases.

(Time t6)

When the internal pressure of the heater 100 becomes almost equal to atmospheric pressure, the gas supply through the inlet port 140 is stopped. This time is referred to as t6. At this time, the solder 30 is in a molten state. If voids had appeared in the solder 30 from time t2 to time t5, the voids have already contracted.

(Time t6 to Time t7)

After time t6, the temperature of the substrate 10 is decreased while atmospheric pressure is maintained. Thus, the solder 30 is solidified.

(Time t7)

The time at which the temperature of the substrate 10 becomes a normal temperature is referred to as t7. By this time, the solder 30 has been solidified. Although the time at which the substrate 10 becomes the normal temperature is referred to as t7 in this embodiment, it is not limited to the normal temperature if only it becomes sufficiently lower than the solidus temperature of the solder 30. After time t7, the substrate 10 is taken out of the decompressing type heater 100.

As above, solder joining of the substrate 10 and the electronic component 20 is finished.

Figure 6:
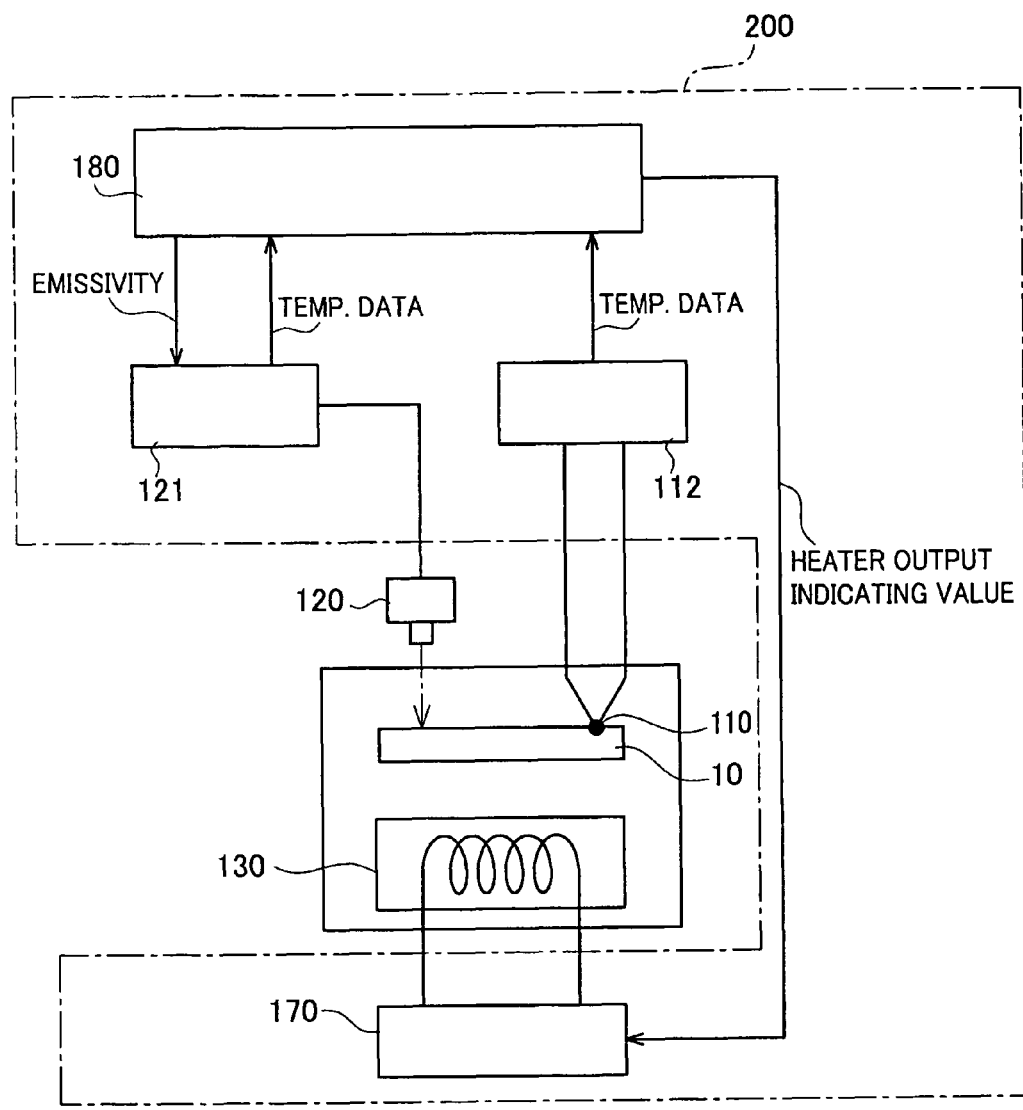
FIG. 6 is a block diagram to explain a temperature controlling method employed in the decompressing type heater according to the present invention.

The following explanation is given to a temperature controlling method in the heating process of the decompressing type heater 100 in this embodiment. FIG. 6 is a block diagram to explain a temperature controlling system 200 of the heater 100. The temperature controlling system 200 of the heater 100 includes a controlling part 180, a contact-temperature-measuring-part temperature indicator ("temperature indicator") 112, a radiation thermometer controller 121, and a heater controller 170.

The controlling part 180 is configured to control the temperature and the pressure in the decompressing type heater 100 and replace atmosphere thereof. The temperature indicator 112 is used to display the temperature measured by the contact temperature measuring part 110 and transmit temperature data to the controlling part 180. The radiation thermometer controller 121 is configured to transmit temperature data measured by the radiation thermometer 120 to the controlling part 180. The heater controller 170 is configured to control output of the heater 130 for heating the substrate 10.

Figure 7:
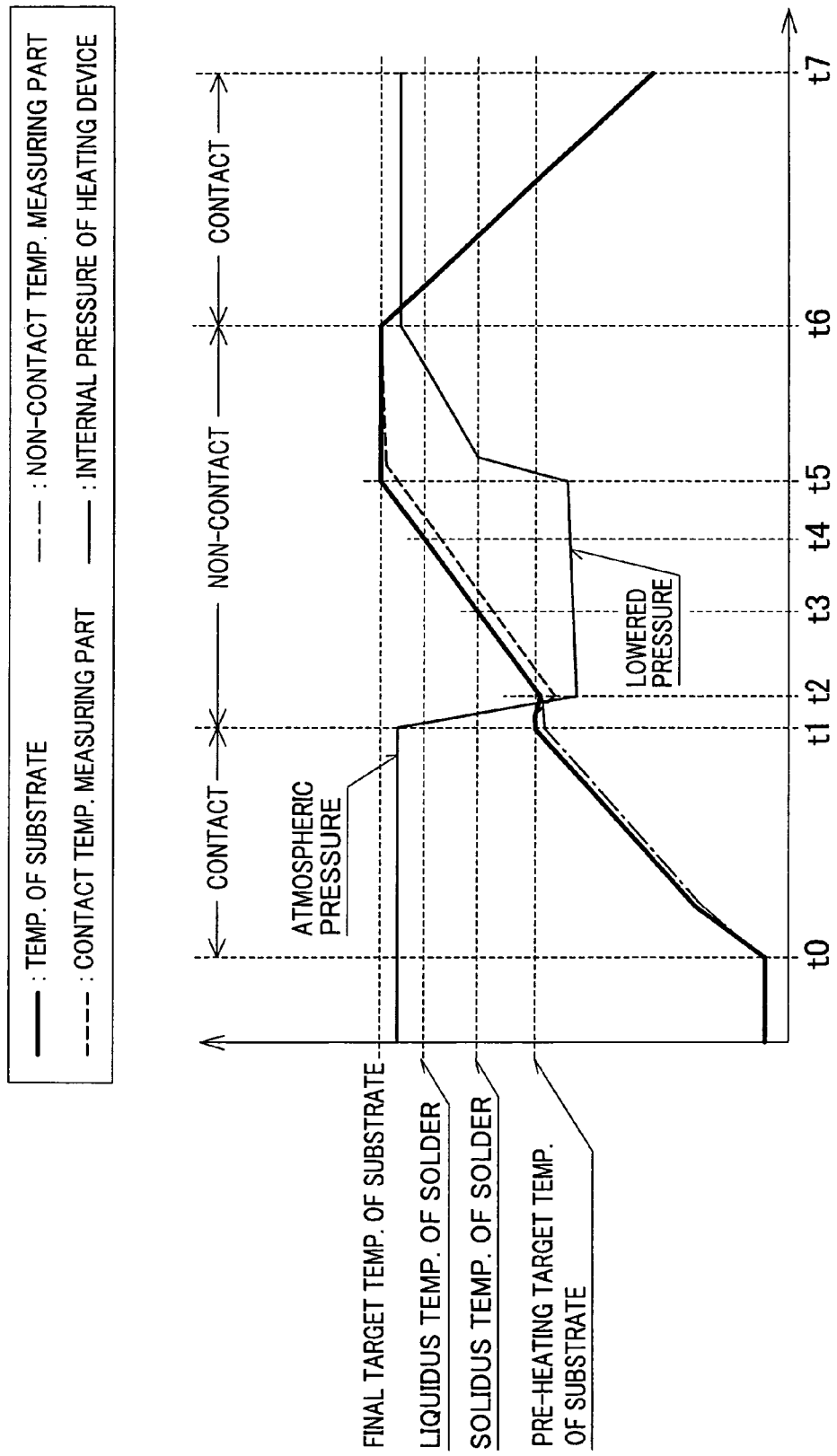
FIG. 7 is a graph to explain the temperature controlling method in the method of manufacturing the electronic product by the decompressing type heater according to the present invention.

The temperature controlling method by the temperature controlling system 200 of the decompressing type heater 100 is explained with reference to FIG. 7 as well as FIG. 6.

At time t0, the contact temperature measuring part 110 is in contact with the substrate 10. The temperature measuring part 110 measures the temperature of a contact portion with the substrate 10. The temperature measured by the temperature measuring part 110 is transmitted to the temperature indicator 112. Then, the temperature measured by the temperature measuring part 110 is further transmitted from the temperature indicator 112 to the controlling part 180.

On the other hand, the radiation thermometer 120 also measures the surface temperature of the substrate 10. The temperature measured by the radiation thermometer 120 is transmitted to the radiation thermometer controller 121. Then, the temperature measured by the radiation thermometer 120 is further transmitted from the radiation thermometer controller 121 to the controlling part 180.

Specifically, the controlling part 180 receives both the temperature of the substrate 10 measured by the contact temperature measuring part 110 and that by the radiation thermometer 120.

From time t0 to time t1, pre-heating of the substrate 10 is conducted. Because the deoxidizing atmosphere has been provided, cleaning of the substrate 10 is sufficiently advanced by the pre-heating. This causes a change in emissivity of infrared rays from the surface of the substrate 10. Therefore the radiation thermometer 120 could not accurately measure the temperature of the substrate 10 with the emissivity setting unchanged from that before cleaning. On the other hand, the internal pressure of the heater 100 is almost equal to atmospheric pressure. The contact temperature measuring part 110 can measure accurate temperature. From time t0 to time t1, accordingly, the controlling part 180 uses values measured by the contact temperature measuring part 110 as the temperature of the substrate 10.

For a period from time t0 to time t1, the controlling part 180 adopts the temperature from the contact temperature measuring part 110 while adjusting the setting of the emissivity in the radiation thermometer 120. The controlling part 180 calculates the emissivity to be set in the radiation thermometer 120 so that the radiation thermometer 120 outputs the temperature equal to the temperature measured by the contact temperature measuring part 110.

This calculated emissivity is fed back to the radiation thermometer controller 121. Thus, the emissivity corresponding to the cleaning of the substrate 10 is newly set in the radiation thermometer 120. The use of the radiation thermometer 120 having the adjusted emissivity makes it possible to accurately measure the actual temperature of the substrate 10. After completion of adjustment, the temperature of the cleaned substrate 10 can be measured by the radiation thermometer 120 under either of atmospheric pressure and lowered pressure.

After time t1, the internal pressure of the decompressing type heater 100 decreases. For this period, the temperature measured by the contact temperature measuring part 110 is read as a value lower than the actual temperature of the substrate 10. This is because there is the aforementioned gap as shown in FIG. 2 whereby decreases the thermal conductivity of gas.

After time t1, therefore, the temperature of the substrate 10 measured by the radiation thermometer 120 having the adjusted emissivity is adopted instead of the contact temperature measuring part 110. Based on the temperature measured by the radiation thermometer 120, the heating condition of the heater 130 is set. Furthermore, the time at which the temperature of the substrate 10 measured by the radiation thermometer 120 reaches the final target temperature is referred to as t5.

At time t6, the internal pressure of the decompressing type heater 100 is almost equal to atmospheric pressure. The temperature of the substrate 10 is therefore measured again by the contact temperature measuring part 110. After time t6, the temperature of the substrate 10 may be measured only by the contact temperature measuring part 110.

At time t6, furthermore, whether or not the temperature of the substrate 10 measured by the radiation thermometer 120 (the measured temperature of the substrate 10 from time t1 to t6) was accurate can be checked based on the measured value of the contact temperature measuring part 110. Herein, the following explanation is given to the case where a difference exists between the measured temperature of the contact temperature measuring part 110 and the measured temperature of the radiation thermometer 120 at time t6.

The difference in measured temperature at time t6 between the contact temperature measuring part 110 and the radiation thermometer 120 is considered to have occurred due to advanced cleaning of the surface of the substrate from time t1 to time t6. However, since the cleaning has remarkably advanced by the pre-heating from time t0 to time t1 and the concentration of the reducing gas is low under lowered pressure, this difference in measured temperature should not be so large.

By further correcting the emissivity of the radiation thermometer 120, therefore, the temperature of objects can be measured more accurately in next and subsequent heating operations. At time t6, the internal pressure of the heater 100 is almost equal to the atmospheric pressure and thus the accurately measured value can be ascertained by the contact temperature measuring part 110. Accordingly, the emissivity to be set in the radiation thermometer 120 can be determined at time t6. Even at time t1, on the other hand, the emissivity to be set in the radiation thermometer 120 is determined by the aforementioned temperature control method. No reason is also found why the emissivity rapidly changes in the course from time t1 to time t6.

Consequently, from time t1 to time t6, the emissivity is gradually changed from the emissivity to be set at time t1 to the emissivity to be set at time t6. Herein, a difference between the emissivity to be set at time t1 and the emissivity to be set at time t6 is not so large.

As above, the setting of the emissivity in the radiation thermometer 120 can be changed to follow the change in emissivity of the substrate 10 from time t1 to time t6. Thus, in the next and subsequent heating operations, objects can be heated based on more accurate temperatures from time t1 to time t6.

The temperature of the substrate 10 is measured as mentioned above by the contact temperature measuring part 110 from time t0 to time t1, by the radiation thermometer 120 having the adjusted emissivity from time t1 to time t6, and by the temperature measuring part 110 again from time t6 to time t7. Specifically, when the internal pressure of the decompressing type heater 100 is almost equal to atmospheric pressure, the temperature of the substrate 10 measured by the contact temperature measuring part 110 is adopted. While the internal pressure of the heater 100 is lower than atmospheric pressure, the temperature of the substrate 10 measured by the radiation thermometer 120 is adopted.

The above configurations can realize the decompressing type heater 100 and the heating method thereof capable of measuring the actual temperature of the substrate 10, feeding it back to the heating condition of the substrate 10, and solder joining the substrate 10 and the electronic component 20 along an optimum temperature profile, and the method of manufacturing the electronic product by using them.

Figure 8:
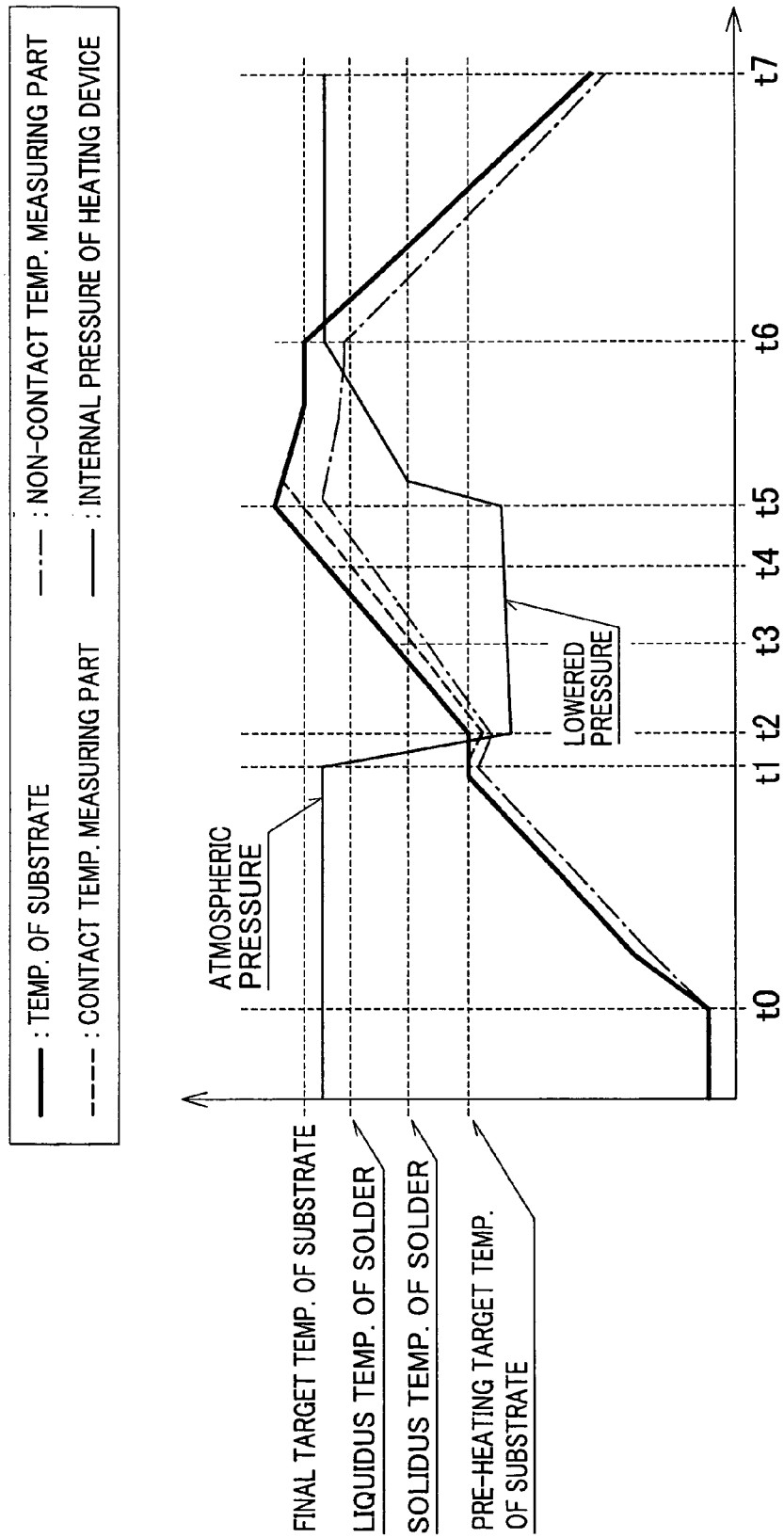
FIG. 8 is a graph to explain a temperature controlling method in a method of manufacturing an electronic product by a decompressing type heater in a prior art.
Figure 9:
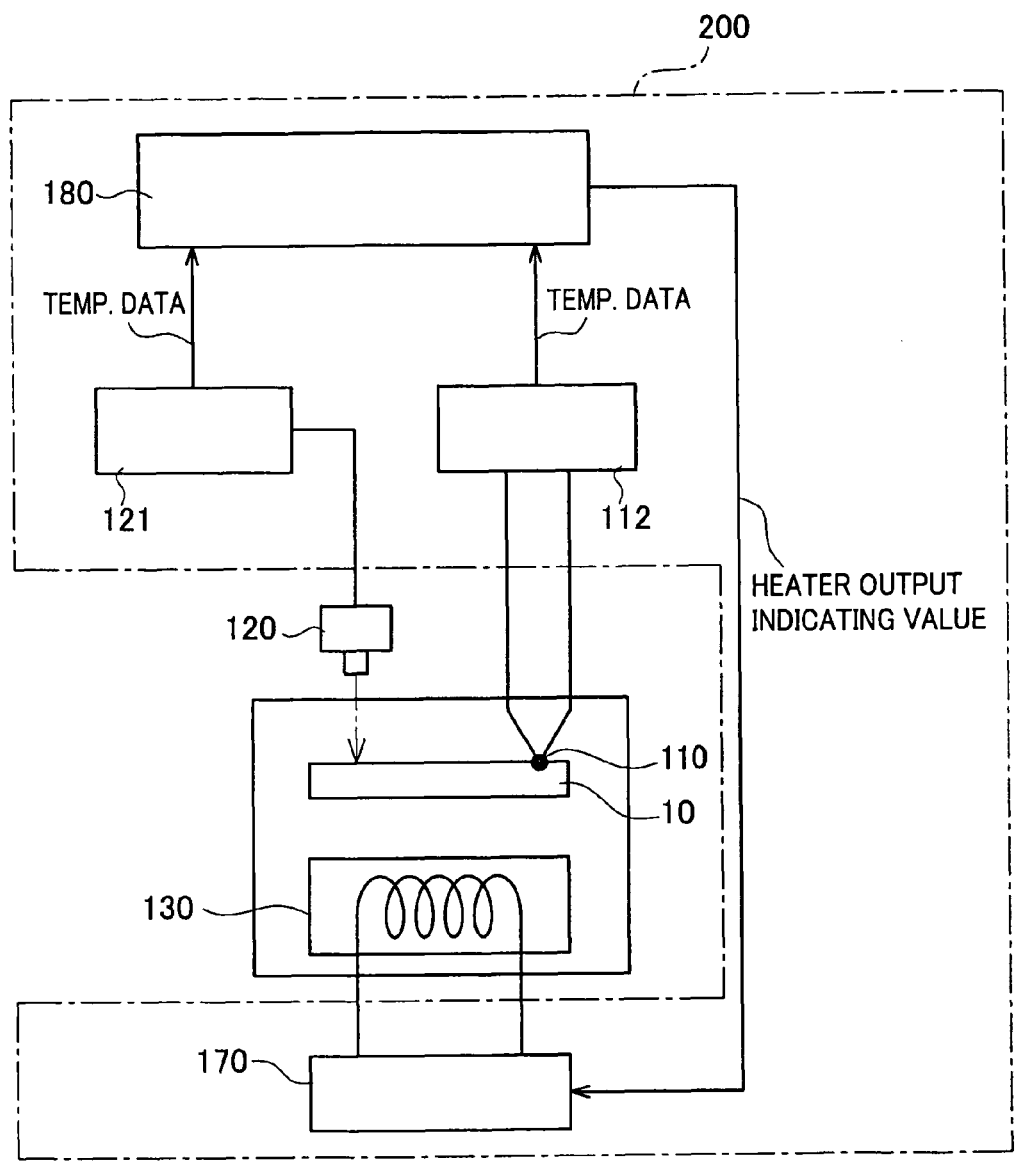
FIG. 9 is a block diagram to explain another example of the temperature controlling method employed in the decompressing type heater according to the present invention.

For comparison with the present embodiment, the case of controlling the heating condition of the heater 130 based on only the temperature measured by the contact temperature measuring part 110 is explained with reference to FIG. 8. For reference, the temperature measured by the radiation thermometer 120 with unadjusted emissivity is also shown in FIG. 8.

When the internal pressure of the decompressing type heater 100 decreases after time t1, a difference occurs between the temperature measured by the contact temperature measuring part 110 and the accurate temperature of the substrate 10. This is because the aforementioned gap exists as shown in FIG. 2 and the thermal conductivity of gas in the gap decreases by pressure dropping. Accordingly, the temperature of the substrate 10 measured by the contact temperature measuring part 110 is lower than the actual temperature of the substrate 10.

Therefore, in the case of performing the temperature control of the decompressing type heater 100 by only the contact temperature measuring part 110, when it is judged that the temperature of the substrate 10 reaches the final target temperature and the heating of the substrate 10 by the heater 130 is stopped, the actual temperature of the substrate 10 will have exceeded the final target temperature.

As a result, the temperature of the electronic component 20 may exceed the upper limit temperature, causing characteristics changes. Furthermore, it is impossible to ascertain what degree of temperature the substrate 10 has actually reached at time t5. In other words, it is impossible to ascertain what degree of temperature the electronic component 20 has reached. Moreover, there are also variations resulting from repeatability of the contact state of the contact temperature measuring part 110 with the substrate 10. Such disturbance makes it difficult to control the qualities of products.

On the other hand, even in the measurement using only the radiation thermometer 120, the actual temperature of the substrate 10 cannot be measured. It is to be noted that such disadvantage is not caused in this embodiment.

In the above description, the emissivity of the radiation thermometer 120 is adjusted prior to measurement of the actual temperature of the object to be heated. However, the actual temperature of the object to be heated may also be measured without adjustment of the emissivity of the radiation thermometer 120. For instance, this corresponds to the case where the controlling part 180 corrects an output value of the temperature of the radiation thermometer 120 having unadjusted emissivity.

During the pre-heating of the object to be heated from time t0 to time t1, a correction coefficient to correct the output value of the radiation thermometer 120 is determined in advance based on the measured value of the contact temperature measuring part 110 and the measured value of the radiation thermometer 120. By use of this correction coefficient, the actual temperature of the object to be heated from time t1 to time t6 can be measured by the radiation thermometer 120. This can provide the same effects as in the first embodiment.

In the decompressing type heater of this embodiment as mentioned in detail above, the contact temperature measuring part and the non-contact temperature measuring part are used together. Specifically, under atmospheric pressure, the substrate is heated based on the temperature of the substrate measured by the contact temperature measuring part and, under lowered pressure, the substrate is heated based on the temperature of the substrate measured by the non-contact temperature measuring part.

As a result, the substrate can be heated while the temperature of the substrate is controlled in all the steps in correspondence with changes in internal pressure of the heater and changes in the surface condition of the substrate resulting from cleaning. Consequently, the decompressing type heater can be realized capable of restraining the occurrence of voids and solder joining the substrate and the electronic component under strict temperature control.

It is therefore possible to control the heating based on the actual temperature of the substrate, not based on the temperature of the heater. Furthermore, the actual temperature of the measured substrate also acts as a signal to transfer to a next step. Electronic products with no variations in quality can be manufactured accordingly. Thus, solder-joining to the substrate of a semiconductor device needing an atmosphere replacement step can be performed with high reliability.

The embodiment is merely an example and does not limit the present invention. Thus, the present invention may be embodied in other specific forms without departing from the essential characteristics thereof. For instance, the objects to be solder joined may be not only the substrate and the electronic component but also a cooling member and the substrate. It is further possible to solder join the cooling member, the substrate, and the electronic component together at once.

The controlling part 180 may be configured to act as all of the temperature indicator 112, the radiation thermometer controller 121, and the heater controller 170, because the same effects are obtained as above.

The heater may be not only a contact type but also a lamp heater, an induction coil depending on an object, or hot air. After the solder 30 is melted and the internal pressure of the heater is returned to atmospheric pressure, cooling may be performed in a separate furnace. The liquidus temperature and the solidus temperature of the solder are mere examples and depend on the kind of solder to be used.

The number of the contact temperature measuring part 110 and the radiation thermometer 120 may be plural. If a large difference between the temperature indicated by the contact temperature measuring part 110 and the temperature indicated by the radiation thermometer 120 at time t6, an alarm may also be sounded. Any other than the reducing gas may be used if only it has substantially deoxidizing atmosphere from the viewpoint of the object. It is to be noted that there is also a case where air may be used depending on an object.

The contact temperature measuring part 110 and the radiation thermometer 120 are preferably placed to measure nearer portions of the substrate 10, because it is assumed that a difference in actual temperature between measured portions is smaller as the measured portions are nearer.

Furthermore, the decompressing type heater and the heating method thereof of the present invention are not limited to the purpose of solder joining. If it is used for heating under lowered pressure after pre-heating in an atmosphere of reducing gas, the same effects can be obtained.

The invention claimed is:

1. A decompressing type heater having a heat treatment chamber formed with an outlet port, the heater being configured to pre-heat an object placed in the heat treatment chamber to a pre-heating temperature under atmospheric pressure and heat the object to a higher temperature than the pre-heating temperature under lowered pressure, the heater comprising:

a heater for heating the object in the heat treatment chamber;
a contact temperature measuring part for measuring the temperature of the object in contact relation therewith in the heat treatment chamber;
a non-contact temperature measuring part for measuring the temperature of the object in non-contact relation therewith in the heat treatment chamber; and
a controlling part for controlling the heater and adjusting the non-contact temperature measuring part,
the controlling part being adapted
to adjust setting of temperature error of the non-contact temperature measuring part to eliminate a difference of a measured value of the non-contact temperature measuring part with respect to a measured value of the contact temperature measuring part during pre-heating under atmospheric pressure, and
to control the heater based on the measured value of the adjusted non-contact temperature measuring part during heat treatment under lowered pressure.

2. The decompressing type heater according to claim 1, wherein
the non-contact temperature measuring part is a radiation thermometer for detecting infrared rays emitted from the object to be heated, and
the controlling part adjusts setting of emissivity in the radiation thermometer during the pre-heating under atmospheric pressure.

3. The decompressing type heater according to claim 1, wherein
the non-contact temperature measuring part is a radiation thermometer for detecting infrared rays emitted from the object to be heated, and
the controlling part adjusts a correction coefficient of an output value of the radiation thermometer during the pre-heating under atmospheric pressure.

4. The decompressing type heater according to claim 1, wherein
the heat treatment chamber is formed with a gas inlet port, and
the heater includes a gas supplying unit for supplying atmospheric gas into the heat treatment chamber through the gas inlet port.

5. The decompressing type heater according to claim 4, wherein
the pre-heating under atmospheric pressure is performed while a reducing atmospheric gas is supplied into the heat treatment chamber.

6. The decompressing type heater according to claim 1, further including an exhausting unit connected to the outlet port to discharge gas from the heat treatment chamber to lower internal pressure.

7. The decompressing type heater according to claim 2, wherein
the heat treatment chamber is formed with a gas inlet port, and
the heater includes a gas supplying unit for supplying atmospheric gas into the heat treatment chamber through the gas inlet port.

8. The decompressing type heater according to claim 7, wherein
the pre-heating under atmospheric pressure is performed while a reducing atmospheric gas is supplied into the heat treatment chamber.

9. The decompressing type heater according to claim 8, further including an exhausting unit connected to the outlet port to discharge gas from the heat treatment chamber to lower internal pressure.

10. The decompressing type heater according to claim 7, further including an exhausting unit connected to the outlet port to discharge gas from the heat treatment chamber to lower internal pressure.

11. The decompressing type heater according to claim 2, further including an exhausting unit connected to the outlet port to discharge gas from the heat treatment chamber to lower internal pressure.

12. The decompressing type heater according to claim 3, wherein
the heat treatment chamber is fanned with a gas inlet port, and
the heater includes a gas supplying unit for supplying atmospheric gas into the heat treatment chamber through the gas inlet port.

13. The decompressing type heater according to claim 12, further including an exhausting unit connected to the outlet port to discharge gas from the heat treatment chamber to lower internal pressure.

14. The decompressing type heater according to claim 12, wherein
the pre-heating under atmospheric pressure is performed while a reducing atmospheric gas is supplied into the heat treatment chamber.

15. The decompressing type heater according to claim 14, further including an exhausting unit connected to the outlet port to discharge gas from the heat treatment chamber to lower internal pressure.

16. The decompressing type heater according to claim 3, further including an exhausting unit connected to the outlet port to discharge gas from the heat treatment chamber to lower internal pressure.

17. The decompressing type heater according to claim 4, further including an exhausting unit connected to the outlet port to discharge gas from the heat treatment chamber to lower internal pressure.

18. The decompressing type heater according to claim 5, further including an exhausting unit connected to the outlet port to discharge gas from the heat treatment chamber to lower internal pressure.

19. A method of heating an object under temperature control using a contact temperature measuring part and a non-contact temperature measuring part, the method comprising:
heating the object to a pre-heating temperature lower than a heat treatment temperature in an atmosphere of deoxidizing gas under atmospheric pressure while adjusting setting of emissivity in the non-contact temperature measuring part based on a measured value of the contact temperature measuring part and controlling the temperature of the object, and
further heating the object to the heat treatment temperature under lowered pressure while controlling the temperature of the object based on a measured value of the non-contact temperature measuring part having the setting of emissivity adjusted in the process of heating to the pre-heating temperature.

20. A method of manufacturing an electronic product by heating an object including a plurality of members to be joined under lowered pressure to solder join them, the method comprising:
heating the object to a pre-heating temperature at which solder does not melt in an atmosphere of deoxidizing gas under atmospheric pressure while adjusting setting of emissivity in the non-contact temperature measuring part based on a measured value of the contact temperature measuring part and controlling the temperature of the object;
lowering pressure;
further heating the object to the heat treatment temperature under lowered pressure while controlling the temperature of the object based on a measured value of the non-contact temperature measuring part having the setting of emissivity adjusted in the process of heating to the pre-heating temperature;
returning the pressure of the atmosphere to the atmospheric pressure while maintaining the heat treatment temperature of the object; and
solidifying the solder under the atmospheric pressure to solder join the object.

* * * * *